(12) United States Patent
Chi et al.

(10) Patent No.: US 11,462,640 B2
(45) Date of Patent: Oct. 4, 2022

(54) LDMOS TRANSISTOR HAVING VERTICAL FLOATING FIELD PLATE AND MANUFACTURE THEREOF

(71) Applicant: SiEn (QingDao) Integrated Circuits Co., Ltd., Shandong (CN)

(72) Inventors: Min-Hwa Chi, Qingdao (CN); Min Li, Qingdao (CN)

(73) Assignee: SiEn (QingDao) Integrated Circuits Co., Ltd., Qingdao (CN)

( * ) Notice: Subject to any disclaimer, the term of this patent is extended or adjusted under 35 U.S.C. 154(b) by 0 days.

(21) Appl. No.: 17/468,389

(22) Filed: Sep. 7, 2021

(65) Prior Publication Data

US 2022/0102551 A1    Mar. 31, 2022

(30) Foreign Application Priority Data

Sep. 30, 2020 (CN) .......................... 202011064546.5

(51) Int. Cl.
| | | |
|---|---|---|
| H01L 29/78 | (2006.01) | |
| H01L 29/66 | (2006.01) | |
| H01L 29/51 | (2006.01) | |
| H01L 29/40 | (2006.01) | |

(52) U.S. Cl.
CPC ........ *H01L 29/7824* (2013.01); *H01L 29/402* (2013.01); *H01L 29/516* (2013.01); *H01L 29/66681* (2013.01)

(58) Field of Classification Search
CPC . H01L 29/7824; H01L 29/402; H01L 29/516; H01L 29/66681; H01L 29/0653; H01L 29/404; H01L 29/7816; H01L 29/407
See application file for complete search history.

(56) References Cited

U.S. PATENT DOCUMENTS

2017/0346477 A1* 11/2017 Xia .................... H01L 29/1095
2021/0234041 A1* 7/2021 Jin .................... H01L 29/66681

OTHER PUBLICATIONS

Zhang et al., "Experiments of a Novel low on-resistance LDMOS with 3-D Floating Vertical Field Plate", May 19-23, 2019, pp. 507-510, Proceedings of the 31st International Symposium on Power Semiconductor Devices & ICs, Shanghai, China.

* cited by examiner

*Primary Examiner* — Mohammed R Alam
(74) *Attorney, Agent, or Firm* — Chen Yoshimura LLP

(57) ABSTRACT

The present application provides a LDMOS transistor having a floating vertical field plate (VFP) and a manufacturing method thereof. The floating VFP comprises a floating field plate polysilicon layer and a laminated structure. The laminated structure comprises a stack of alternate layers of insulating material and ferroelectric material, and in the laminated structure, an outermost layer and an innermost layer are the insulating material. In the present application, the polarization in the ferroelectric material is set in the floating VFP with smaller size, the polarization of the ferroelectric layer enhances the "charge sharing" effect to produce higher breakdown voltage when the transistor is off; and the polarization of the ferroelectric material layer induces more electrons in the drift zone to reduce on resistance when the transistor is on. Accordingly, the increase of breakdown voltage and the reduction of on resistance can be achieved simultaneously.

10 Claims, 3 Drawing Sheets providing a semiconductor substrate, wherein the semiconductor substrate comprises a first conductive-type doping region forming a second conductive-type well region in the first conductive-type doping region forming a vertical floating field plate, wherein the vertical floating field plate extends vertically from the first conductive-type doping region and along its surface, wherein the vertical floating field plate comprises a floating field plate polysilicon layer and a laminated structure, the laminated structure comprises an alternate stack of insulating material layers and ferroelectric material layers, and, in the laminated structure, an outermost layer and an innermost layer are the insulating material layers forming a gate structure, a source region and a drain region, wherein the source region is located in the second
conductive-type well region, the drain region is located in the first conductive-type doping region, and the gate structure contacts to the source region, the second conductive-type well region and the first conductive-type doping region, and the vertical floating field plate is between the second conductive-type well region and the drain region

FIG. 1

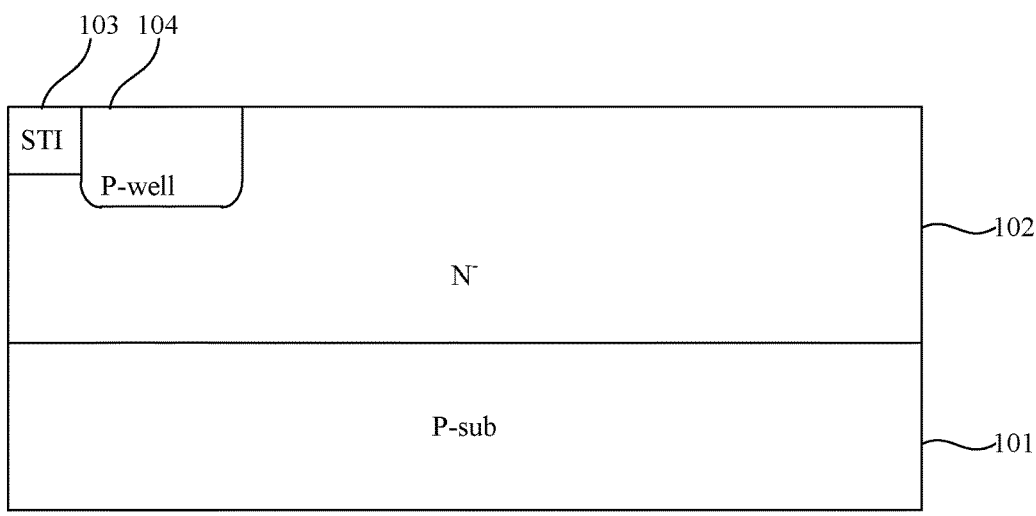

FIG. 2

LDMOS TRANSISTOR HAVING VERTICAL FLOATING FIELD PLATE AND MANUFACTURE THEREOF

BACKGROUND OF THE INVENTION

1. Field of the Invention

The present invention relates to a power semiconductor, and particularly to a LDMOS transistor having a floating vertical field plate (VFP) and its manufacturing method.

2. Description of the Related Art

Power semiconductor is widespread in applications of consumer electronics, computers, network/telecommunication, LED displays, electronic lighting and the like because of its properties such as high input impedance, low loss, fast on-off switch, and broad safe operating area.

In power device applications, the vertical double-diffused metal-oxide-semiconductor (DMOS) transistors utilize vertical device structure (similar to vertical NPN bipolar transistor) have various advantages including high current drive capability, low on-resistance ($R_{on}$), high breakdown voltage (BV) and the like. DMOS transistors mainly have two types: the vertical double-diffused metal oxide semiconductor field effect transistor (VDMOSFET or VDMOS) and the laterally double-diffused metal oxide semiconductor field effect transistor (LDMOSFET or LDMOS). Comparing with the conventional planar field effect transistor, the LDMOS transistors have significant advantages on the critical device properties such as gain, linearity, switch performance, heat dissipation, high breakdown voltage, reduction of stages in circuit design and the like. In addition, LDMOS transistors are widely used because of its compatibility with CMOS process.

In LDMOS transistor devices, the breakdown voltage (BV) and the on resistance ($R_{on}$) are the most important parameters to determine the device performance Currently, considering the two performance parameters, the general design request for a power device is not only high BV at off-state but also low $R_{on}$ at on-state to serve as an ideal power switch. However, there is tradeoff between high BV and low $R_{on}$ in power device, it is always a goal to achieve better tradeoff for the LDMOS transistor.

In a prior art, there was a design of a novel LDMOS transistor having a floating vertical field plate (VFP) and its manufacturing method that the tradeoff between BV and $R_{on}$ is significantly improved as shown in the reference (G. Zhang, et.al., "Experiments of a Novel low on-resistance LDMOS with 3-D Floating Vertical Field Plate", ISPSD, p. 507, 2019). It is the objective of this invention that a new enhancement of the structure of the floating VFP by inserting a ferroelectric layer and method can further enhance the BV at off-state and lower the Ron at on-state.

SUMMARY

Considering the disadvantages of the conventional technologies, the present application provides a LDMOS transistor having a floating vertical field plate (VFP) with ferroelectric layer and a manufacturing method thereof. The present application is able to solve the problem that higher BV and lower $R_{on}$ are difficult to achieve simultaneously in prior art, and performance of conventional LDMOS transistor cannot be further improved.

For the above and the relevant purposes, the present application provides a LDMOS transistor having a floating VFP with ferroelectric layer. The LDMOS transistor comprises:

a semiconductor substrate comprising a first conductivity type doping region;

a second conductivity type well region located in the first conductivity type doping region;

a source region located in the second conductivity type well region;

a drain region located in the first conductivity type doping region;

a floating VFP located between the second conductivity type well region and the drain region and extending vertically from the first conductivity type doping region and along its surface, wherein the floating VFP comprises a floating field plate polysilicon layer and a laminated structure, the laminated structure comprises a stack of alternate layers of insulating material and ferroelectric material, and, in the laminated structure, an outermost layer and an innermost layer are the insulating layers; and a gate structure contacting to the source region, the second conductivity type well region, and the first conductivity type doping region.

In one embodiment, the ferroelectric material comprises a hafnium oxide-based material doped with aluminum, zirconium or a combination thereof.

In one embodiment, the laminated structure comprises two layers of the ferroelectric material and each ferroelectric layer has a thickness of 10 nm~300 nm.

In one embodiment, the LDMOS transistor comprises M≥2 of the vertical floating field plate, and the vertical floating field plate has a sectional width W, wherein 1000 nm≥W≥100 nm.

In one embodiment, the floating VFP has a bottom located in the first conductivity type doping region or extending to the lower part of the first conductivity type doping region.

In one embodiment, the LDMOS transistor further comprises a metal part corresponding to the floating VFP, wherein the metal part connects to or insulate from the floating VFP.

The present application further provides a method for manufacturing a LDMOS transistor having a floating VFP, comprising the following steps:

providing a semiconductor substrate, wherein the semiconductor substrate comprises a first conductivity type doping region;

forming a second conductivity type well region in the first conductivity type doping region;

forming a floating VFP, wherein the floating VFP extends vertically from the first conductivity type doping region and along its surface, wherein the vertical floating field plate comprises a floating field plate polysilicon layer and a laminated structure, the laminated structure comprises a stack of alternate layers of insulating material and ferroelectric material, and, in the laminated structure, an outermost layer and an innermost layer are the insulating layers;

forming a gate structure, a source region and a drain region, wherein the source region is located in the second conductivity type well region, the drain region is located in the first conductivity type doping region, and the gate structure contacts to the source region, the second conductivity type well region and the first conductivity type doping region, and the vertical floating field plate is between the second conductivity type well region and the drain region.

In one embodiment, the ferroelectric material comprises a hafnium oxide-based material doped with aluminum, zirconium or a combination thereof, the ferroelectric layer has a thickness of 10 nm~300 nm. The ferroelectric material can be formed by physical vapor deposition (PVD) or atomic layer deposition (ALD).

In one embodiment, the method further comprises, prior to the step of forming the floating VFP, forming a first conductivity type well region.

In one embodiment, the method further comprises: forming a metal part corresponding to the floating VFP. The formed metal part connects to or insulate from the floating VFP.

According to the above, in the LDMOS transistor having the floating VFP and the manufacturing method in the present application, because the ferroelectric layer having polarization is set in the floating VFP with smaller size, the polarization of the ferroelectric layer enhances the effect of "charge sharing" to produce higher BV when the transistor is off, and, the polarization of the ferroelectric layer induces more electrons in the drift zone to reduce $R_{on}$ when the transistor is on. Accordingly, the LDMOS transistor with the increased BV (at off-state) and the reduced $R_{on}$ (at on-state) can be achieved. Moreover, the present application provides a simple manufacturing method. The selected ferroelectric material is well compatible with CMOS and has broad applications. By setting multiple ferroelectric layers in the floating VFP, the total polarization after re-crystallization can be further enhanced, thereby, the BV of the LDMOS transistor can be further increased and the $R_{on}$ can also be further reduced.

BRIEF DESCRIPTION OF THE DRAWINGS

FIG. 1 shows a flow chart of a method for manufacturing a LDMOS transistor of the present application.

FIG. 2 shows the structure after forming the second conductivity type well region.

DETAILED DESCRIPTION OF THE EMBODIMENTS

Figure 3:
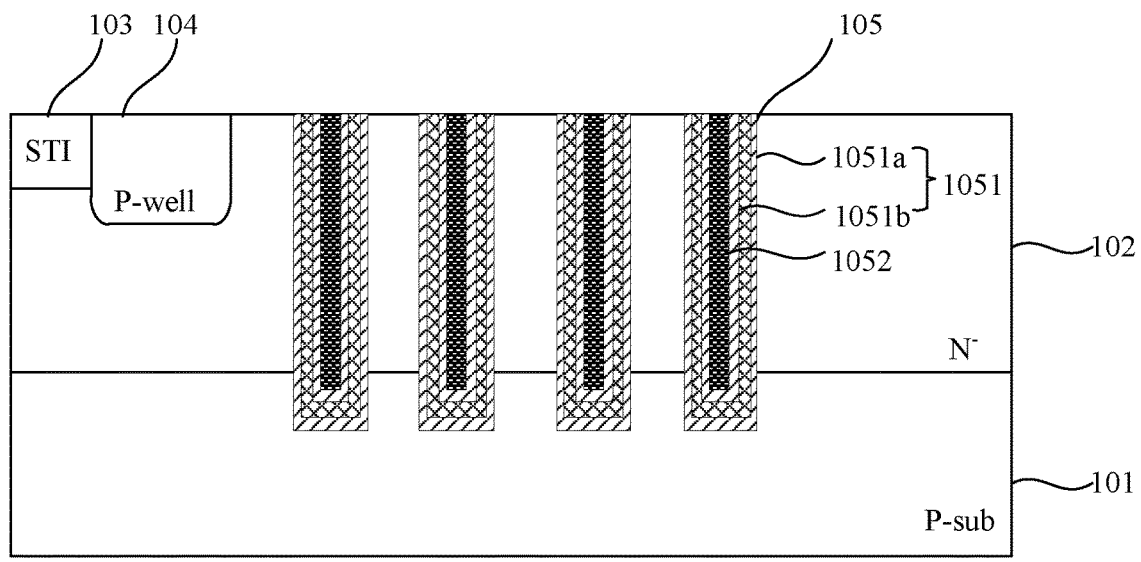
FIG. 3 shows the structure after forming the floating VFP.

In the summary of the invention, a series of concepts in a simplified form is introduced, which will be described in further detail in the detailed description. This summary of the present invention does not intend to limit the key elements or the essential technical features of the claimed technical solutions, nor intend to limit the scope of the claimed technical solution.

In the detailed description of the present invention, for ease of description, the cross-sectional view of the structure of the device will be partially enlarged not based on the scale. The schematic diagram is merely illustrative, but does not limit the scope of the present invention. In addition, the three-dimensional size of length, width and depth should be included in the actual manufacturing.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. In addition, when a layer is referred to as being "between" two layers, it may be the only layer between the two layers, or one or more intervening layers. As used herein, "between" means to include the end point value.

In the context of the present application, the described structure in which the first feature is "above" the second feature may include an embodiment in which the first and second features are formed in direct contact, or may include other features formed between the first and second features, so that the first and second features may not be in direct contact.

It should be noted that the drawings provided in embodiments are merely illustrative for the concepts of the present invention, so that only the components related to the present invention are shown in the drawings but not the actual number, shape and size of components. In practice, the type, number and ratio of each component can be changed randomly, and the layout or type of components may be more complex.

Referring FIG. 1, in this embodiment, a method for manufacturing a LDMOS transistor having a floating vertical field plate (VFP) is provided. The ferroelectric material layer having polarization is set in the floating VFP with smaller size, therefore, the polarization of the ferroelectric material layer enhances the effect of "charge sharing" to produce higher BV when the transistor is off, and, the polarization of the ferroelectric layer induces more electrons in the drift zone to reduce $R_{on}$ when the transistor is on. Accordingly, the LDMOS transistor with increased BV and reduced $R_{on}$ can be achieved.

For easier understanding, an N-type LDMOS transistor is illustrated in this embodiment. A person having ordinary skills in the art can alter the doping type in the corresponding layers in the transistor to obtain a P-type LDMOS transistor having the same structure. It is not restricted herein.

Firstly, a semiconductor substrate is provided. The semiconductor substrate comprises a first conductivity type doping region.

Specifically, referring FIG. 2, in one embodiment, the semiconductor substrate comprises a P-type substrate 101 and an N-type doping region 102 located on the P-type substrate 101. The semiconductor substrate further comprises a STI structure 103. Relevant manufacturing processes for the N-type doping region 102 and the STI structure 103 are not limited herein, and the structure of the semiconductor substrate is not limited by the above description, for example, in another embodiment, the P-type substrate 101 can be replaced by SOI structure or the like.

Then, a second conductivity type well region is formed in the first conductivity type doping region.

Specifically, referring to FIG. 2, in one embodiment, a P-type well region 104 can be formed by applying high-energy ion implantation of impurities. Before or after formation of the P-type well region 104, the step of forming an N-type well region (not shown) can be further conducted. In this embodiment, the N-type doping region 102 is used as the N-type well region to reduce process steps, cost, and convenience of the operation.

Then, a floating VFP is formed. The floating VFP extends vertically from the first conductivity type doping region and along its surface. The floating VFP comprises a floating field plate polysilicon layer and a laminated structure. The laminated structure comprises a stack of alternate layers of insulating material and ferroelectric material. In the laminated structure, an outermost layer and an innermost layer are the insulating material.

Specifically, referring to FIG. 3, in one embodiment, the floating VFP 105 extends vertically from the N-type doping region 102 and along its surface to the inside of the P-type substrate 101, but is not limited herein. In other embodiment, the bottom of the floating VFP 105 is located in the N-type doping region 102, which can be arranged depending on situation. The floating VFP 105 comprises a floating field plate polysilicon layer 1052 and a laminated structure 1051. The laminated structure 1051 comprises a stack of alternate layers of insulating material 1051a and ferroelectric material 1051b. In the laminated structure 1051, an outermost layer and an innermost layer are the insulating material 1051a. In this embodiment, the step of forming the floating VFP 105 is conducted after forming the P-type well region 104, but is not limited. In another embodiment, the step can be conducted prior to the formation of the P-type well region 104.

For example, the method for forming the ferroelectric layer 1051b includes physical vapor deposition (PVD) process or atomic layer deposition (ALD) process. The ferroelectric layer 1051b comprises a hafnium oxide-based material doped with aluminum, zirconium or a combination thereof. To enlarge the applicability, the material of the ferroelectric layer 1051b is CMOS-friendly, and the manufacturing method is well compatible with CMOS.

For example, the ferroelectric layer 1051b has a thickness of 10 nm~300 nm, such as 20 nm, 30 nm, 50 nm, 100 nm, 200 nm or a value between any two of the above mentioned values.

For example, the laminated structure can comprise two ferroelectric material layers 1051b, and each ferroelectric layer 1051b has a thickness of 10 nm~300 nm. By setting the multiple ferroelectric layers 1051b in the floating VFP 105, the total polarization after re-crystallization can be further enhanced.

For example, M≥2 of the floating VFP 105 are included. The floating VFP 105 has a sectional width W, wherein 1000 nm≥W≥100 nm.

In a preferred embodiment, the sectional width W of the floating VFP 105 is 100 nm to decrease the resistance of the vertical floating field plate 105. The sectional width (W) of the vertical floating field plate 105 can be, but not be limited to, such as 200 nm, 400 nm, 500 nm, 800 nm or a value between any two values mentioned above. The number M of the vertical floating field plate 105 can be decided depending on the situation. In this embodiment, four (4) of the vertical floating field plates 105 are applied. The number of the floating VFP 105 can be, but not be limited to, 10, 20, 50 and so on. The plural floating VFP 105 can be arranged in an array. Preferably, the interval between the floating VFP 105 is equal in horizontal direction or vertical direction, but their distribution and morphology is not excessively restricted herein. In addition, the floating VFP 105 has a sectional morphology such as circle, square, rectangle and the like, which is not limited herein.

Then, the gate structure, the source region, and the drain region are formed. The source region is located in the second conductivity type well region. The drain region is located in the first conductivity type doping region. The gate structure contacts to the source region, the second conductivity type well region and the first conductivity type doping region, and the floating VFP is located between the second conductivity type well region and the drain region.

Figure 4:
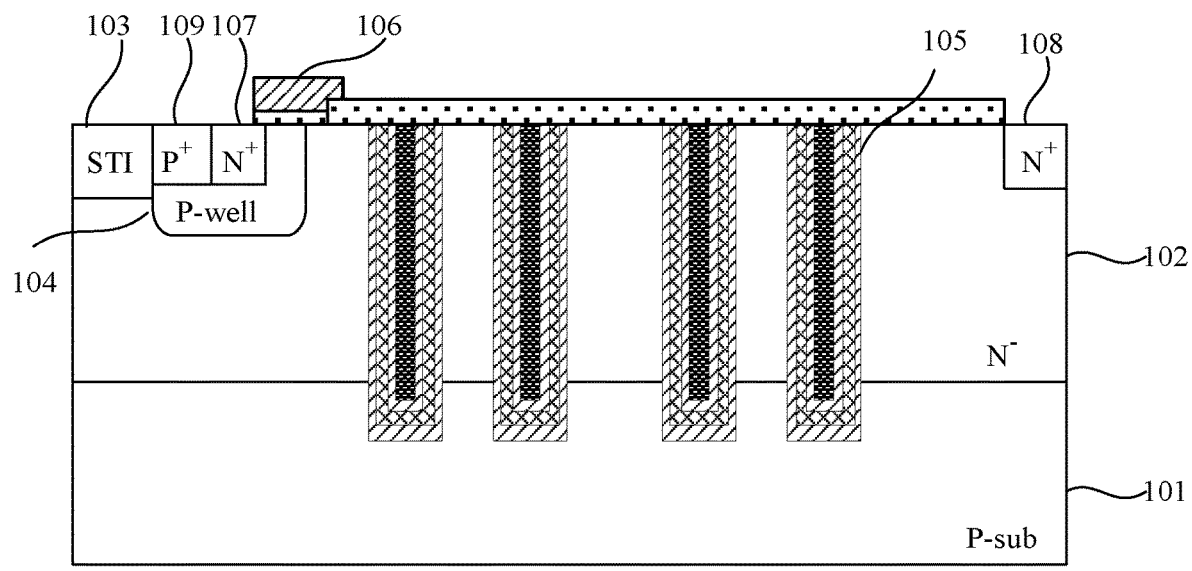
FIG. 4 shows, according to one embodiment, the structure of the LDMOS transistor having the floating VFP.

Referring to FIG. 4, in one embodiment, a method with gate priority is applied to form the gate structure 106. However, the method is not limited herein, but a method with gate last can be applied in another embodiment. The gate structure 106 comprises a gate dielectric layer and a gate conductive layer. In addition, the gate structure 106 further comprises a side wall structure (not shown) to enhance mechanical properties of the gate structure 106 and ensure the insulation between the gate structure 106 and the following formed source drain electrodes. In this embodiment, the N-type doping region 102 is directly used as N-type well region, so that the source region 107 is located in the second conductivity type well region 104, and the drain region 108 is located in the first conductivity type doping region 102.

Moreover, after forming the side wall spacer of the gate, step of forming a lightly doped drain (LDD) region (not shown) and a halo doped region (not shown) can be further conducted. The doping type of LDD region is opposite to that of the halo doped region. For example, in manufacture of NMOS, the ion type of the LDD doping region is N-type, and that of the halo doped region is P-type.

In one embodiment, a step of forming a metal part 110 corresponding to the floating VFP 105 is further conducted. The relationship between the formed metal part 110 and the floating VFP 105 comprise one of connection or insulation.

Figure 5:
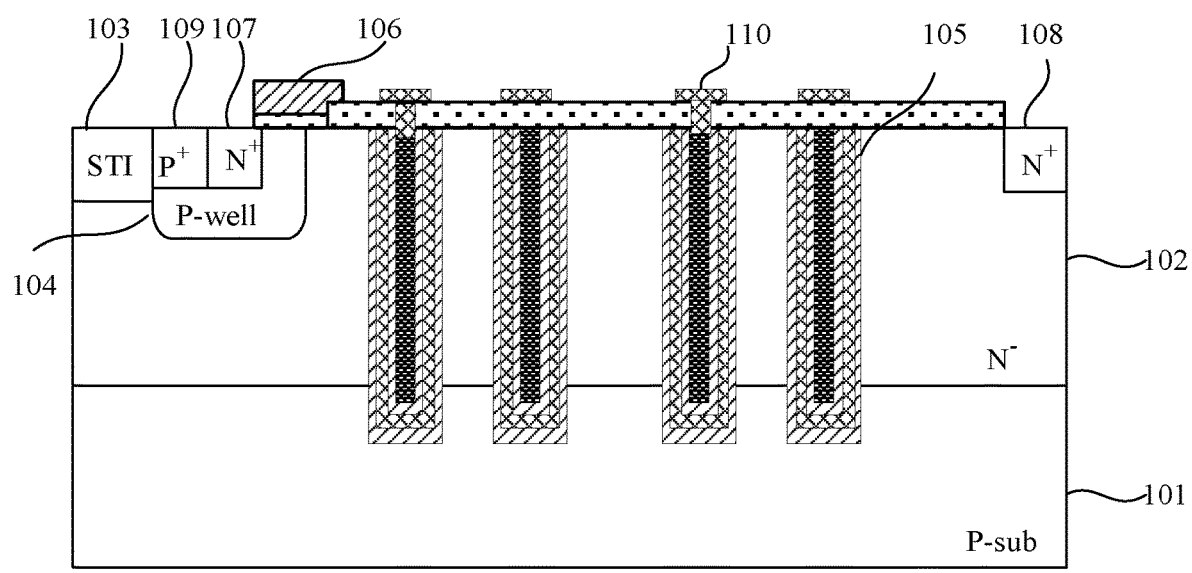
FIG. 5 shows, according to another embodiment, the structure of the LDMOS transistor having the floating VFP.

Specifically, FIG. 5 shows the structure comprising the metal part 110. The metal part 110 connects to the floating VFP 105. While the distance between the floating VFP 105 and the source is equal to that between the floating VFP 105 and the drain, the floating VFP 105 electrically connects to the metal part 110 to form equipotential ring, but it is not limited herein. In another embodiment, the metal part 110 can insulate from the floating VFP 105.

Then, step of forming a dielectric layer (not shown) and an interconnection metal layer (not shown) is further included, which can be conducted according to the existing process. It is not excessively limited herein.

This embodiment also provides a LDMOS transistor having a floating VFP. The LDMOS transistor can be manufactured according to the above method, but not be limited herein.

In one embodiment, the LDMOS transistor comprises a semiconductor substrate, a second conductivity type well region, a source region, a drain region, a vertical floating field plate and a gate structure. The semiconductor substrate has the first conductivity type doping region. The second conductivity type well region is located in the first conductivity type doping region. The source region is located in the second conductivity type well region. The drain region is located in the first conductivity type doping region. The floating VFP is located between the second conductivity type well region and the drain region, and extend vertically from the first conductivity type doping region and along its surface. The floating VFP comprises a floating field plate polysilicon layer and a laminated structure. The laminated structure comprises a stack of alternate layers of insulating material and ferroelectric material, and, in the laminated structure, an outermost layer and an innermost layer are the insulating materials. The gate structure contacting with the source region, the second conductivity type well region, and the first conductivity type doping region.

This example illustrates the N-type LDMOS transistor. A person having ordinary skills in the art is able to alter the corresponding doping type in the LDMOS transistor to obtain the P-type LDMOS transistor. The N-type LDMOS transistor can be manufactured by the above method, so that the manufacturing process, materials and structures of the LDMOS transistor can be referred to the above description.

Specifically, referring to FIG. 4, the LDMOS transistor comprises a P-type substrate 101, a N-type doping region 102, a STI structure 103, a P-type well 104, a vertical floating field plate 105, a gate structure 106, a source region 107, a drain region 108 and a P-type contacting region 109. The floating VFP comprises a laminated structure 1051 and a polysilicon layer 1052. The laminated structure 1051 comprises insulating material layers 1051a and ferroelectric material layers 1051b.

In one embodiment, the ferroelectric layer 105 comprises a hafnium oxide-based material doped with aluminum, zirconium or a combination thereof.

In one embodiment, the laminated structure comprises two ferroelectric material layers 105, and each ferroelectric material layer 105 has a thickness of 10 nm~300 nm.

In one embodiment, the LDMOS transistor comprises M≥2 of the floating VFP 105, and the floating VFP 105 has a sectional width (W), in which 1000 nm≥W≥100 nm.

In one embodiment, the floating VFP 105 has a bottom located in the first conductivity type doping region or extending to the lower part of the first conductivity type doping region.

In one embodiment, the LDMOS transistor further comprises a metal part 110, which is corresponding to the floating VFP 105. The relationship between the metal part 110 and the floating VFP 105 comprise one of connection or insulation.

According to the above, in the LDMOS transistor having the floating VFP and the manufacturing method in the present application, because the ferroelectric layer having polarization is set in the floating VFP with smaller size, the polarization of the ferroelectric layer enhances the effect of "charge sharing" to produce higher BV when the transistor is off, and, the polarization of the ferroelectric layer induces more electrons in the drift zone to reduce $R_{on}$ when the transistor is on. Accordingly, the LDMOS transistor with the increased BV and the reduced $R_{on}$ can be achieved. Moreover, the present application provides a simple manufacturing method. The formation of ferroelectric layer is well compatible with CMOS process and is widely used. By setting multiple ferroelectric layers in the floating VFP, the total polarization after re-crystallization can be further enhanced, thereby, the BV of the LDMOS transistor can be further increased and the $R_{on}$ can be reduced.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims and its equivalent systems and methods.

What is claimed is:

1. A laterally diffused metal oxide semiconductor (LDMOS) transistor having a floating vertical field plate (VFP) comprising:
   a semiconductor substrate comprising a first conductivity type doping region;
   a second conductivity type well region located in the first conductivity type doping region;
   a source region located in the second conductivity type well region;
   a drain region located in the first conductivity type doping region;
   a floating VFP located between the second conductivity type well region and the drain region and extending vertically from the first conductivity type doping region and along its surface, wherein the floating VFP comprises a floating field plate polysilicon layer and a laminated structure, the laminated structure comprises a stack of alternate layers of insulating material and ferroelectric material, and, in the laminated structure, an outermost layer and an innermost layer are the insulating material; and
   a gate structure contacting with the source region, the second conductivity type well region, and the first conductivity type doping region.

2. The LDMOS transistor of claim 1, wherein the ferroelectric material comprises a hafnium oxide-based material doped with aluminum, zirconium or a combination thereof.

3. The LDMOS transistor of claim 1, wherein the laminated structure comprises two layers of the ferroelectric material and each ferroelectric layer has a thickness of 10 nm~300 nm.

4. The LDMOS transistor of claim 1, which comprises M≥2 of the floating VFP, and the floating VFP has a sectional width (W), wherein 1000 nm≥W≥100 nm.

5. The LDMOS transistor of claim 1, wherein the floating VFP has a bottom located in the first conductivity type doping region or extending to the lower part of the first conductivity type doping region.

6. The LDMOS transistor of claim 1, further comprising a metal part corresponding to the floating VFP, wherein the metal part and the floating VFP comprise one of connection or insulation.

7. A method for manufacturing a LDMOS transistor having a floating VFP, comprising:
   providing a semiconductor substrate, wherein the semiconductor substrate comprises a first conductivity type doping region;
   forming a second conductivity type well region in the first conductivity type doping region;
   forming a floating VFP, wherein the floating VFP extends vertically from the first conductivity type doping region and along its surface, wherein the floating VFP comprises a floating polysilicon layer and a laminated structure, the laminated structure comprises a stack of alternate layers of insulating material and ferroelectric material, and in the laminated structure an outermost layer and an innermost layer are the insulating material;
   forming a gate structure, a source region and a drain region, wherein the source region is located in the second conductivity type well region, the drain region is located in the first conductivity type doping region, and the gate structure contacts to the source region, the second conductivity type well region and the first conductivity type doping region, and the floating VFP is between the second conductivity type well region and the drain region.

8. The method of claim 7, wherein the ferroelectric material comprises a hafnium oxide-based material doped with aluminum, zirconium or a combination thereof, the ferroelectric layer has a thickness of 10 nm~300 nm, wherein the ferroelectric layer is formed by physical vapor deposition (PVD) or atomic layer deposition (ALD).

9. The method of claim 7, further comprising: forming a first conductivity type well region prior to the step of forming the floating VFP.

10. The method of claim 7, further comprising: forming a metal part corresponding to the floating VFP, wherein the formed metal part and the floating VFP comprise one of connection or insulation.

* * * * *